United States Patent
Shinoda et al.

(10) Patent No.: US 8,765,509 B2
(45) Date of Patent: Jul. 1, 2014

(54) METHOD FOR PRODUCING GROUP III NITRIDE SEMICONDUCTOR LIGHT-EMITTING DEVICE

(75) Inventors: Daisuke Shinoda, Kiyosu (JP); Shugo Nitta, Kiyosu (JP); Yoshiki Saito, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 183 days.

(21) Appl. No.: 13/137,997

(22) Filed: Sep. 23, 2011

(65) Prior Publication Data

US 2012/0083063 A1 Apr. 5, 2012

(30) Foreign Application Priority Data

Sep. 30, 2010 (JP) ................. 2010-220461
Sep. 30, 2010 (JP) ................. 2010-220462
Sep. 30, 2010 (JP) ................. 2010-220463

(51) Int. Cl.
*H01L 33/32* (2010.01)

(52) U.S. Cl.
USPC .................. 438/47; 257/E33.028

(58) Field of Classification Search
USPC ........... 438/94, 931, 47; 257/77, 85, E33.028
See application file for complete search history.

(56) References Cited

U.S. PATENT DOCUMENTS

| | | | |
|---|---|---|---|
| 8,183,557 B2 | 5/2012 | Iza et al. | |
| 8,211,727 B2 | 7/2012 | Hanawa et al. | |
| 8,421,107 B2 | 4/2013 | Shinohara et al. | |
| 8,471,266 B2 | 6/2013 | Hanawa et al. | |
| 2002/0038870 A1* | 4/2002 | Kunisato et al. | 257/85 |
| 2003/0006409 A1 | 1/2003 | Ohba | |
| 2003/0057444 A1* | 3/2003 | Niki et al. | 257/200 |
| 2008/0237570 A1 | 10/2008 | Choi et al. | |
| 2009/0072262 A1 | 3/2009 | Iza et al. | |

(Continued)

FOREIGN PATENT DOCUMENTS

| | | |
|---|---|---|
| JP | 11-145063 (A) | 5/1999 |
| JP | 2003-318441 A | 11/2003 |

(Continued)

OTHER PUBLICATIONS

Japanese Office Action dated Nov. 27, 2012, for JPO 2010-220462, with English translation.

(Continued)

*Primary Examiner* — Zandra Smith
*Assistant Examiner* — Toniae Thomas
(74) *Attorney, Agent, or Firm* — McGinn IP Law Group, PLLC

(57) ABSTRACT

A method for producing a Group III nitride semiconductor light-emitting device includes an n-type layer, a light-emitting layer, and a p-type layer, each of the layers being formed of Group III nitride semiconductor, being sequentially deposited via a buffer layer on a textured sapphire substrate. A buried layer is formed of Group III nitride semiconductor on the buffer layer, at a temperature lower by 20° C. to 80° C. than the temperature of 1000° C. to 1200° C. when the n-type layer is deposited on the buried layer. The texture provided on the sapphire substrate may have a depth of 1 μm to 2 μm and a side surface inclined by 40° to 80°. A preventing layer may be formed of GaN at 600° C. to 1050° C. so as to cover the entire top surface of the buffer layer.

12 Claims, 11 Drawing Sheets

(56) References Cited

U.S. PATENT DOCUMENTS

| | | |
|---|---|---|
| 2009/0236629 A1 | 9/2009 | Nishikawa et al. |
| 2010/0308357 A1 | 12/2010 | Horie et al. |
| 2011/0095327 A1 | 4/2011 | Shinohara et al. |
| 2011/0147763 A1 | 6/2011 | Hanawa et al. |
| 2011/0198560 A1 | 8/2011 | Okagawa et al. |
| 2012/0205625 A1 | 8/2012 | Iza et al. |
| 2012/0248457 A1 | 10/2012 | Hanawa et al. |
| 2012/0299014 A1* | 11/2012 | Hikosaka et al. ............... 257/77 |

FOREIGN PATENT DOCUMENTS

| | | |
|---|---|---|
| JP | 2006-128527 A | 5/2006 |
| JP | 2006-196543 A | 7/2006 |
| JP | 2007-019318 A | 1/2007 |
| JP | 2007-19318 A | 1/2007 |
| JP | 2008-252096 A | 10/2008 |
| JP | 2009-94089 A | 4/2009 |
| JP | 2009-135466 A | 6/2009 |
| JP | 2010-40867 A | 2/2010 |
| JP | 2010-161354 A | 7/2010 |
| JP | 2010-263236 A * | 11/2010 |
| WO | WO 2009/039402 A1 | 3/2009 |
| WO | WO 2009/102033 A1 | 8/2009 |
| WO | WO 2009/154215 A1 | 12/2009 |

OTHER PUBLICATIONS

Japanese Office Action dated Nov. 27, 2012, for JPO 2010-220463, with English translation.

Japanese Office Action dated Jul. 30, 2013, with Partial English translation.

Chinese Office Action dated Dec. 2, 2013, with English translation.

* cited by examiner

No concentration of dislocations

Large pits on the concentration of dislocations

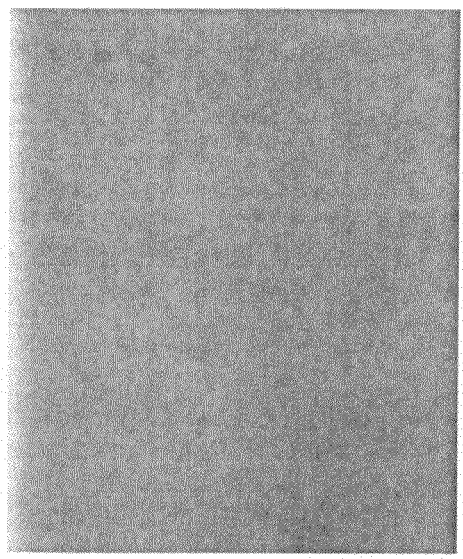
FIG. 10A  When the thermal cleaning temperature is 1168°C — AlN buf.
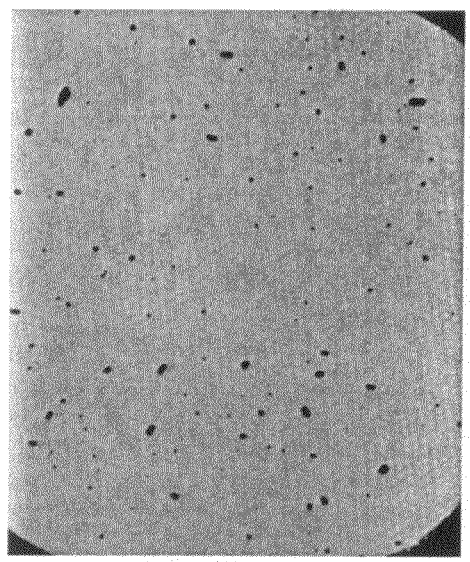
FIG. 10B  GaN buf.

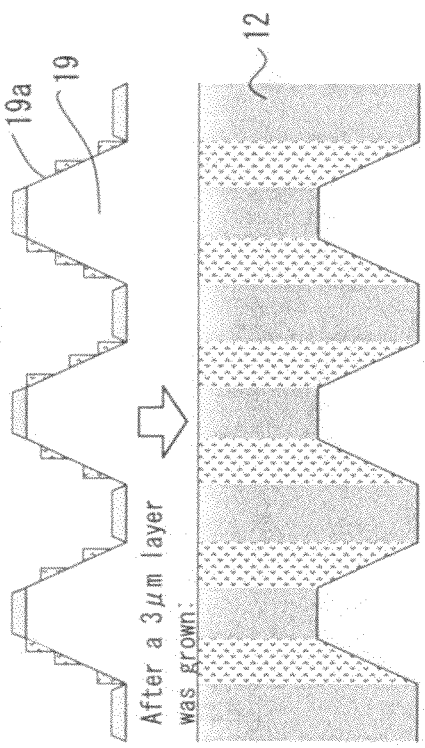

FIG. 11A

When AlN is used

Early growth stage: GaN is selectively grown only on the c-plane.

After a 3 μm layer was grown.

High quality crystals having the same crystal orientation

FIG. 11B

When GaN is used

Early growth stage: Polycrystals and crystals of GaN with a growth surface except for c-plane are grown on the side surface that is not the c-plane.

After a 3 μm layer was grown.

Crystals containing polycrystals and crystals having different crystal orientations grown on the side surface

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device exhibiting improved light extraction efficiency by using a textured sapphire substrate.

2. Background Art

Recently, Group III nitride semiconductor light-emitting devices have been used for general lighting purposes, and improvement of light extraction efficiency is strongly demanded. One of the well-known methods for improving light extraction efficiency is to texture a sapphire substrate having a c-plane main surface, as is disclosed in Japanese Patent Application Laid-Open (kokai) No. 2003-318441 or 2007-19318. When the sapphire substrate is flat without texturing, a light propagating in a direction horizontal to the sapphire substrate inside an element, is confined in a semiconductor layer and attenuated due to repeated multiple reflection. However, the light propagating in a horizontal direction can be emitted outside through reflection and scattering in a vertical direction by providing a texture on the sapphire substrate, resulting in improvement of light extraction efficiency.

One conceivable approach to further improve light extraction efficiency is to increase the texture depth of the sapphire substrate. However, when the texture depth is increased, a large pit is generated on a region where dislocations are concentrated due to bending of dislocation. Such large pit causes the deterioration of the electrical characteristics of the device, for example, the reduction of the electrostatic breakdown voltage.

In addition, to sufficiently improve light extraction efficiency, preferably the depth of the texture on the sapphire substrate is increased, and the inclination angle of a side surface of the texture (the angle of the side surface of the concave portion or the side surface of the convex portion with respect to the main surface of the sapphire substrate) falls within a range of 40° to 80°. However, such approach increases the regions that are not the c-plane on the sapphire substrate, leading to generation of pits on the crystal surface or uneven crystallinity. This results in the deterioration of the electrical characteristics of the device, for example, the reduction of the electrostatic breakdown voltage.

Studies by the present inventors have shown that the pit is generated due to mass transport of a buffer layer. When the temperature increases to the temperature at which an n-contact layer is formed after the formation of the buffer layer on the sapphire substrate, the buffer layer is moved to the c-plane of the sapphire substrate through mass transport. Thus, a region without the buffer layer is generated on the sapphire substrate. Since there are both regions with and without the buffer layer as the seeds of crystal growth, crystal defects are concentrated in the region without the buffer layer, and a pit is generated therein, resulting in the deterioration of the electrical characteristics, for example, the reduction of the electrostatic breakdown voltage.

SUMMARY OF THE INVENTION

In view of the foregoing, an object of the present invention is to provide a method for producing a Group III nitride semiconductor light-emitting device, in which method pit generation is suppressed as well as light extraction efficiency is further improved by using a textured sapphire substrate.

The present invention reached completion by solving the above problems. Its object is to provide a method for producing a Group III nitride semiconductor light-emitting device, in which method pit generation is suppressed in the crystal when the side surface of the texture is inclined by 40° to 80° with respect to the main surface of the sapphire substrate.

In a first aspect of the present invention, there is provided a method for producing a Group III nitride semiconductor light-emitting device comprising an n-type layer, a light-emitting layer, and a p-type layer, which are made of Group III nitride semiconductor, sequentially deposited on a buffer layer which is deposited on a sapphire substrate having a c-plane main surface, said main surface having a texture structure, the method comprising:

forming the texture on the sapphire substrate so as to have a depth of 1 μm to 2 μm;

forming a buried layer of GaN on the buffer layer, to flatten a top surface by burying the texture, at a temperature which is lower by 20° C. to 80° C. than that when the n-type layer is formed; and forming the n-type layer on the buried layer at a temperature of 1000° C. to 1200° C.

The texture structure means that the surface of the sapphire substrate has many concave portions or many convex portions. In a second aspect of the present invention, there is provided method for producing a Group III nitride semiconductor light-emitting device comprising an n-type layer, a light-emitting layer, and a p-type layer, which are made of Group III nitride semiconductor, sequentially deposited on a buffer layer which is deposited on a sapphire substrate having a c-plane main surface, said main surface having a texture structure, the method comprising:

forming the texture on the sapphire substrate so as to have a side surface inclined by 40° to 80° with respect to the main surface of the sapphire substrate and a depth of 1 μm to 2 μm;

forming a preventing layer of GaN to prevent mass transport of the buffer layer at a temperature of 600° C. to 1050° C. so as to cover the entire top surface of the buffer layer; and forming the n-type layer at a temperature of 1050° C. to 1200° C. on the preventing layer.

In a third aspect of the present invention, there is provided a method for producing a Group III nitride semiconductor light-emitting device comprising layers which are made of Group III nitride semiconductor, sequentially deposited on a buffer layer which is deposited on a sapphire substrate having a c-plane main surface, said main surface having a texture structure, the method comprising:

forming the texture on the sapphire substrate so as to have a depth of 1.2 μm to 2.5 μm and a side surface inclined by 40° to 80° with respect to the main surface of the sapphire substrate; and forming a buffer layer of Group III nitride semiconductor containing Al.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

The texture provided on the sapphire substrate has a pattern in which dot-like concave portions or dot-like convex portions are periodically arranged in a matrix or a pattern in which concave portions or convex portions are arranged in a stripe pattern. Each dot-like concave portion or convex portion is, for example, a truncated pyramid, a truncated conoid, a rectangular column, a circular column, a pyramid, a conoid, or a hemisphere. The reason for the texture (the depth of the concave portion or the height of the convex portion) having a depth of 1 µm to 2 µm is as follows. When the depth of the texture is smaller than 1 µm, light extraction efficiency is not sufficiently improved. When the depth of the texture is larger than 2 µm, it is difficult to flatten the top surface by burying the texture. More preferably, the depth of the texture is 1.4 µm to 1.8 µm.

In the third aspect, the reason for the texture (the depth of the concave portion or the height of the convex portion) having a depth of 1.2 µm to 2.5 µm is as follows. When the depth of the texture is smaller than 1.2 µm, light extraction efficiency is not sufficiently improved. When the depth of the texture is larger than 2.5 µm, it is difficult to flatten the top surface by burying the texture. More preferably, the depth of the texture is 1.4 µm to 2.0 µm.

In the first and second aspects, the inclination angle of the texture side surface (the angle of the side surface of the concave portion or the side surface of the convex portion with respect to the main surface of the sapphire substrate) is preferably 40° to 80°. This can further improve light extraction efficiency. More preferably, the inclination angle is 50° to 70°. However, when the dot concave portion or convex portion is a hemisphere, the inclination angle means the angle between the flat surface of the sapphire substrate and the tangent of the concave portion or convex portion connecting to the flat surface.

In the third aspect, the inclination angle of the texture side surface is preferably 40° to 80°. This is because when the inclination angle θ falls within this range, light extraction efficiency can be further improved. More preferably, the inclination angle is 50° to 70° to further improve light extraction efficiency.

Preferably, AlN is used as a buffer layer. Pit generation can be suppressed and crystallinity can be improved compared to when GaN is used as a buffer layer.

The higher the Al composition ratio of the buffer layer is, the more effectively pit generation is suppressed in the crystal grown on the buffer layer. Thus, variation in crystal orientation is reduced. Particularly preferably, the buffer layer is formed of AlGaN having an Al composition ratio of 50% or more. Most preferably, the buffer layer is formed of AlN.

Preferably, thermal cleaning is performed in a hydrogen atmosphere at a temperature of 1000° C. to 1200° C. before forming the buffer layer after texturing of the sapphire substrate. Thermal cleaning prevents the crystal core from being formed on the side surface of the texture in the early stage of crystal growth, and can reduce variation in crystal orientation.

Preferably, the buried layer is doped with Si. Since Si doping promotes crystal growth in a vertical direction, pit generation is suppressed, and the top surface is more easily flattened by burying the texture. Preferably, Si concentration is $1 \times 10^{17}/cm^3$ to $1 \times 10^{20}/cm^3$.

Preferably, the buried layer has a thickness of 1 µm to 3 µm. If the thickness is smaller than 1 µm, the texture is not completely buried. If the thickness is larger than 3 µm, the thickness of the overall light-emitting device also becomes thick, which is not preferable. More preferably, the thickness of the buried layer is 1.5 µm to 2.5 µm.

Further, more preferably, the buried layer is formed at a temperature of 1050° C. to 1100° C. in a normal pressure and 1000° C. to 1050° C. in a low pressure to suppress pit generation.

The reason that the preventing layer is formed at a temperature of 600° C. to 1050° C. is that the entire top surface of the buffer layer needs to be covered to prevent mass transport of the buffer layer. Preferably, the preventing layer has a thickness of 20 nm to 1000 nm. When the thickness is smaller than 20 nm, mass transport of the buffer layer is not sufficiently suppressed during the formation of the n-type layer. When the thickness is larger than 1000 nm, crystallinity is deteriorated. More preferably, the thickness of the preventing layer is 50 nm to 500 nm. The preventing layer may be or may not be doped with Si.

Preferably, AlN is used as a buffer layer. Pit generation can be suppressed and crystallinity can be improved compared to when GaN is used as a buffer layer. When AlN is used as a buffer layer, the growth temperature of the preventing layer is preferably 900° C. to 1050° C. Mass transport of the buffer layer can be more effectively suppressed during the formation of the preventing layer. In addition, when GaN is used as a buffer layer, preferably, nitrogen is used as a carrier gas in heating to form the n-type layer. Mass transport of the buffer layer can be effectively suppressed during heating.

According to the first aspect, since the buried layer is formed at a temperature lower by 20° C. to 80° C. than that when the n-type layer is formed, crystal growth is promoted in a vertical direction and lateral bending of dislocations is suppressed. As a result, even if the depth of the texture is increased to 1 µm to 2 µm, generation of a large pit due to lateral bending and concentration of dislocations can be suppressed. Thus, light extraction efficiency can be improved without reducing the electrostatic breakdown voltage of the device.

In addition, the top surface of the buried layer is more easily flattened by doping the buried layer with Si. When the thickness of the buried layer falls within a range of 1 µm to 3 µm, the top surface of the buried layer can be sufficiently flattened. When the inclination angle of the texture side surface is 40° to 80°, light extraction efficiency can be further improved. AlN may be used as a buffer layer. In this case, pit generation can be suppressed compared to when GaN is used as a buffer layer.

According to the second aspect, since the preventing layer is formed so as to cover the entire top surface of the buffer layer, mass transport of the buffer layer can be prevented during heating when forming the n-type layer. As a result, pit generation can be prevented and light extraction efficiency can be improved without reducing the electrostatic breakdown voltage of the device.

In addition, in the second aspect, since the preventing layer is formed at a temperature of 900° C. to 1050° C. with AlN used as a buffer layer, mass transport of the buffer layer can be effectively suppressed when forming the preventing layer. Pit generation can be further suppressed by using AlN as a buffer layer.

Further, in the second aspect, when GaN is used as a buffer layer, mass transport of the buffer layer can be effectively suppressed during heating when forming the n-type layer.

Moreover, in the second aspect, when the thickness of the preventing layer is 20 nm to 1000 nm, mass transport of the buffer layer can be effectively suppressed when forming the n-type layer.

According to the third aspect, even if the sapphire substrate is provided with the texture having a depth of 1.2 µm to 2.5 µm and the side surface inclined by 40° to 80° to improve light extraction efficiency, pit generation can be suppressed in the crystal and variation in crystal orientation can be reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 10A and 10B are photographs showing crystal surfaces of an n-type layer of the Group III nitride semiconductor light-emitting device according to Embodiment 3;

FIGS. 11A and 11B are schematic views showing how crystals are grown in the Group III nitride semiconductor light-emitting device according to Embodiment 3.

DETAILED DESCRIPTION OF PREFERRED EMBODIMENTS

Specific embodiments of the present invention will next be described with reference to the drawings. However, the present invention is not limited to the embodiments.

Embodiment 1

Figure 2:
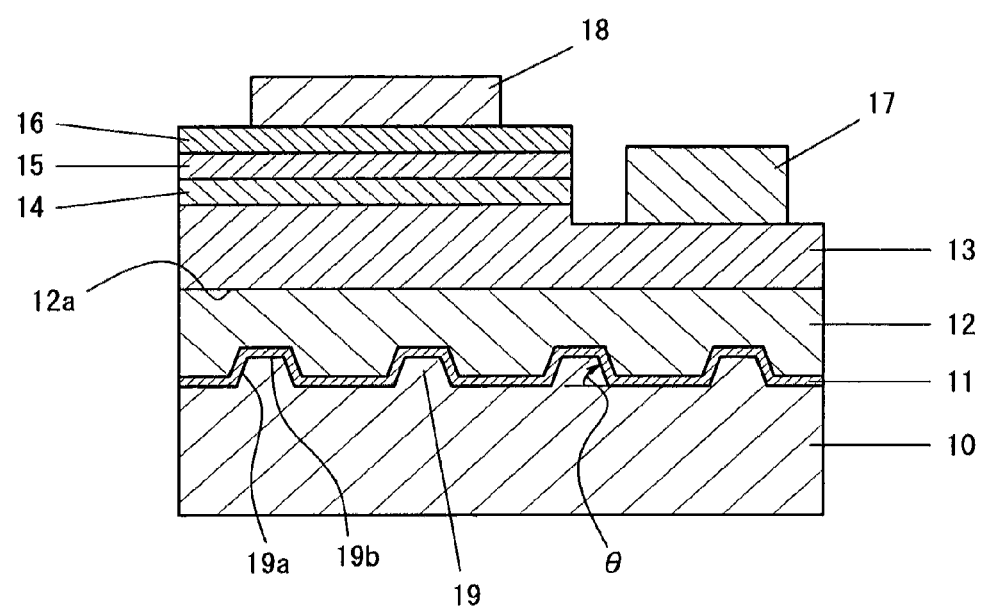
FIG. 2 is the configuration of the Group III nitride semiconductor light-emitting device according to Embodiment 1.

FIG. 2 shows the configuration of the Group III nitride semiconductor light-emitting device according to Embodiment 1. The Group III nitride semiconductor light-emitting device exhibits improved light extraction efficiency by using a textured sapphire substrate 10. The sapphire substrate 10 has a c-plane main surface, and a GaN buried layer 12 is formed thereon via a buffer layer 11. The texture provided on the sapphire substrate 10 has a pattern in which dot-like (truncated hexagonal pyramidal) convex portions 19 having a height of 1.6 μm and a diameter of 3 μm are periodically arranged at intervals of 5 μm. Preferably, a side surface 19a of the convex portion 19 is inclined by 40° to 80° with respect to the main surface of the sapphire substrate 10. When the inclination angle θ falls within this range, light extraction efficiency can be further improved. The buried layer 12 is formed so that a surface 12a is flat by burying the texture. Accordingly in this specification the texture means the state that the surface of the sapphire substrate has many convex portions or concave portions by machining or etching the surface. The buried layer 12 has a thickness of 2 μm (between a top surface 19b of the convex portion 19 and a surface of the buried layer 12). The buried layer 12 is doped with Si at a concentration of $1\times10^{17}/cm^3$ to $1\times10^{20}/cm^3$.

The thickness of the buried layer 12 is not limited to 2 μm, but may fall within a range of 1 μm to 3 μm. If it is smaller than 1 μm, the texture is not completely buried. If it is larger than 3 μm, the thickness of the overall light-emitting device is too thick. More preferably, the thickness of the buried layer 12 is 1.5 μm to 2.5 μm. The buried layer 12 does not necessarily have to be doped with Si. However, Si doping promotes the growth of the buried layer in a vertical direction, and thus the texture is easily buried. Preferably, the buried layer is doped with Si.

The texture pattern formed on the sapphire substrate 10 is not limited to the aforementioned pattern in which the dot convex portions 19 are periodically arranged. The texture pattern may be any pattern, so long as the depth of the texture (the depth of the concave portion or the height of the convex portion) falls within a range of 1 μm to 2 μm. For example, a pattern in which dot-like concave portions are periodically arranged or a pattern in which concave portions or convex portions are arranged in a stripe pattern may be used. Also, the texture pattern does not necessarily have to be periodic. Each dot concave portion or convex portion is, for example, a truncated pyramid, a truncated conoid, a pyramid, a conoid, or a hemisphere. However, in the case of hemisphere, the angle of the tangent to the sapphire substrate is preferably 40° to 80°. In the case of rectangular column or circular column, a side surface of the texture is perpendicular to the main surface of the sapphire substrate 10, and thus light extraction efficiency is less improved, which is not preferred. The present invention uses a sapphire substrate provided with a texture having a depth of 1 μm to 2 μm. The reason for this is as follows. When the depth of the texture is smaller than 1 μm, light extraction efficiency is not sufficiently improved. When the depth of the texture is larger than 2 μm, it is difficult to flatten the surface 12a by the buried layer 12. More preferably, the depth of the texture is 1.4 μm to 1.8 μm.

On the buried layer 12, an n-type layer 13, a light-emitting layer 14, and a p-type layer 15 are sequentially deposited, each of the layers 13 to 15 being formed of Group III nitride semiconductor. A transparent electrode 16 comprising indium tin oxide (ITO) is formed on a part of a surface of the p-type layer 15. A part of the light emitting layer 14 and the p-type layer 15 are removed to expose a part of the n-type layer 13. An n-electrode 17 and a p-electrode 18 are formed on the exposed part of the n-type layer 13 and a part of the transparent electrode 16, respectively.

The n-type layer 13, the light emitting-layer 14, and the p-type layer 15 may have any conventionally known structure. The n-type layer 13 may have, for example, a structure in which an n-type contact layer formed of GaN doped with Si at a high concentration and an n-cladding layer formed of GaN are sequentially deposited on the buried layer 12. The light-emitting layer 14 may have, for example, an MQW structure in which GaN barrier layers and InGaN well layers are alternately deposited repeatedly. The p-type layer 15 may have, for example, a structure in which a p-cladding layer formed of AlGaN doped with Mg and a p-contact layer formed of GaN doped with Mg are sequentially deposited on the light-emitting layer 14.

Next will be described a process for producing the Group II nitride semiconductor light-emitting device according to Embodiment 1 with reference to FIG. 1.

Figure 1A:
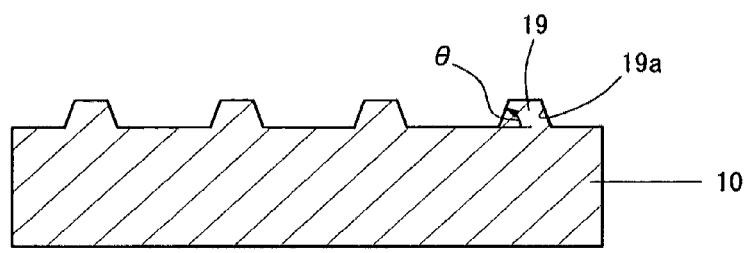
FIGS. 1A to 1D are sketches showing a process for producing a Group III nitride semiconductor light-emitting device according to Embodiment 1.

Firstly, a predetermined pattern texture was formed on a surface of the sapphire substrate 10 by photolithography and dry etching (FIG. 1A). As described above, the texture has a pattern in which the dot-like convex portions 19 are periodically arranged. The height of the convex portion 19 was 1.6 µm. The height can be controlled by the etching time. The inclination angle θ of the side surface 19a of the convex portion 19 can be controlled by the shape of a resist mask. Preferably, the interval of the convex portions 19 is 8 µm or less to improve light extraction efficiency, and 2 µm or more to facilitate burying the texture.

Figure 1B:
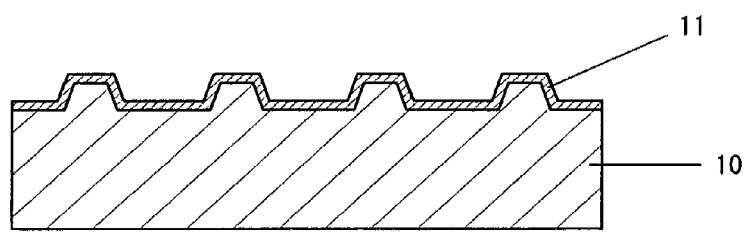

Subsequently, the buffer layer 11 of AlN was deposited on the sapphire substrate 10 at 380° C. by the MOCVD method so as to contour the texture of the sapphire substrate 10 (FIG. 1B). The buffer layer 11 may be formed of GaN. Preferably, AlN is used to suppress pit generation or improve crystallinity.

Preferably, thermal cleaning was performed to remove impurities from the surface of the sapphire substrate 10 before the formation of the buffer layer 11. Thermal cleaning can be performed, for example, in a hydrogen atmosphere at a temperature of 1000° C. to 1200° C.

Figure 1C:
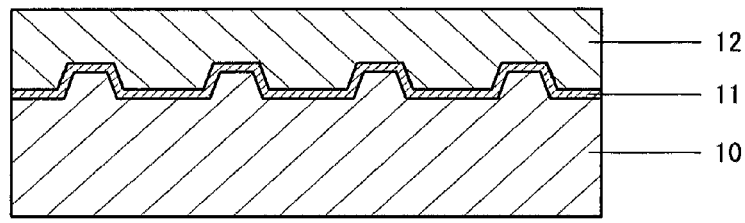

Subsequently, a buried layer 12 of GaN doped with Si was deposited on the buffer layer 11 by the MOCVD method. The growth temperature of the buried layer 12 was 1070° C. lower by 50° C. than that of an n-type layer 13 deposited thereon. The thickness of the buried layer 12 was 2 µm, and the surface of the buried layer 12 was formed to be flat by burying the texture (FIG. 1C). Since the buried layer 12 was grown at a temperature lower than that when the n-type layer 13 is grown, crystal growth was promoted in a vertical direction. This reduced lateral bending of dislocations in the crystal and suppressed the concentration of dislocations. As a result, large pit generation in the crystal was able to be suppressed.

The growth temperature of the buried layer 12 is not necessarily 1070° C., but is preferably lower by 20° C. to 80° C. than that of the n-type layer 13 deposited thereon. When the growth temperature falls within this range, pit generation is sufficiently suppressed. More preferably, the growth temperature is lower by 30° C. to 70° C. than that of the n-type layer 13.

A Group III nitride semiconductor layer to prevent mass transport of the buffer layer 11 may be formed at a temperature of 600° C. to 1050° C. between the buffer layer 11 and the buried layer 12, so as to cover the entire top surface of the buffer layer 11. Mass transport is prevented by forming the preventing layer. This prevents the coexistence of the regions with and without the buffer layer 11. Consequently, pit generation is suppressed, and crystal uniformity is improved.

Preferably, the buried layer 12 is formed of GaN. However, a Group III nitride semiconductor, for example, AlGaN, InGaN, AlGaInN, can also be used, in which a portion of Ga is substituted by Al or In.

Figure 1D:
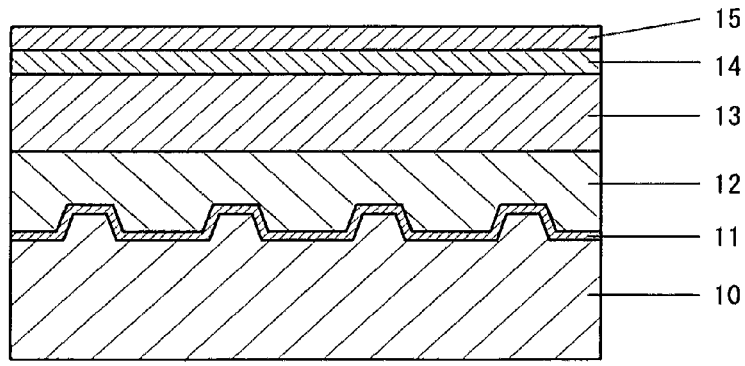

Next, on the buried layer 12, an n-type layer 13 having a thickness of 3 µm was formed at a temperature of 1120° C. higher than the growth temperature of the buried layer 12 by the MOCVD method. The growth temperature of the n-type layer 13 is not limited to the aforementioned temperature, and may fall within a range of 1000° C. to 1200° C. Subsequently, on the n-type layer 13, a light-emitting layer 14, and a p-type layer 15 were sequentially formed by the MOCVD method (FIG. 1D).

Subsequently, a transparent electrode 16 comprising indium tin oxide (ITO) was deposited on a part of a surface of the p-type layer 15. Then, the light emitting layer 14 and the p-type layer 15 were partially etched to expose a part of the n-type layer 13. The n-electrode 17 and the p-electrode 18 were formed on an exposed portion of the n-type layer 13 and a part of the transparent electrode 16, respectively. Through the above, the Group III nitride semiconductor light-emitting device according to Embodiment 1 was produced as shown in FIGS. 1A to 1D.

Figure 3A:
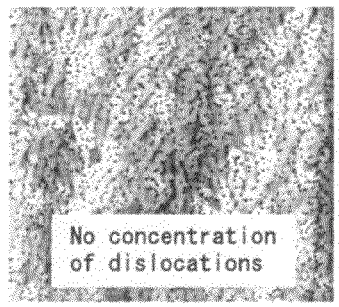
FIGS. 3A and 3B are AFM images of the surface of an n-type layer 13.
Figure 3B:
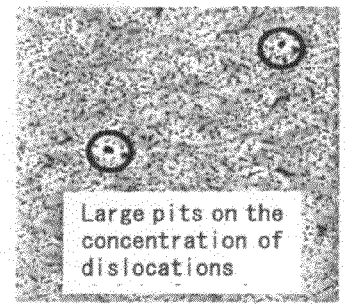
Figure 4:
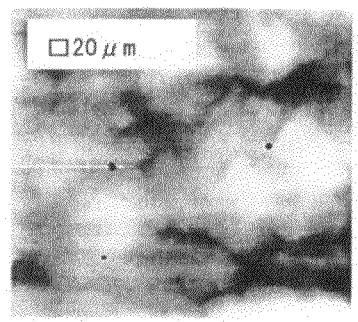
FIG. 4 is an AFM image of the surface of a p-type layer 15.

FIG. 3A shows an AFM image taken of the surface of the n-type layer 13 after stopping the growth in the process for producing the Group III nitride semiconductor light-emitting device according to Embodiment 1. On the other hand, FIG. 3B shows an AFM image taken of the surface of the n-type layer 13 after stopping the growth when the n-type layer 13 was formed without forming the buried layer 12. FIG. 4 shows an AFM image taken of the surface of the p-type layer 15 when the n-type layer 13, the light emitting layer 14, and the p-type layer 15 were sequentially formed without forming the buried layer 12. As shown in FIG. 3B, large pits were formed due to the concentration of dislocations when the buried layer 12 was not formed. It is also found from FIG. 4 that the pits remain even after the p-type layer 15 was formed. In contrast, when the buried layer 12 was formed, large pits were not formed as shown in FIG. 3A.

Figure 5:
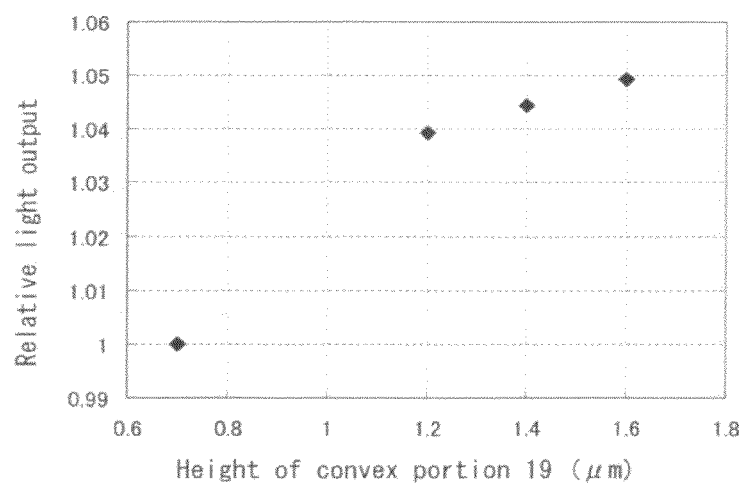
FIG. 5 is a graph showing the relative light output of to the standard light output from the Group III nitride semiconductor light-emitting device according to Embodiment 1.

FIG. 5 is a graph illustrating the light output from the light-emitting devices when the height of the convex portion 19 was varied to 1.2 µm, 1.4 µm, and 1.6 µm in the process for producing the Group III nitride semiconductor light-emitting device according to Embodiment 1. The light output is shown as a relative value to the standard light output from the light-emitting devices having convex portions 19 with a height of 0.7 µm, i.e., the relative value of the standard light output is considered as 1. As is clear from FIG. 5, the higher the convex portion 19, the higher the light extraction efficiency, resulting in improvement of light output. When the convex portion 19 has a height of 1.6 µm, the light output was higher by 5% than that when the convex portion 19 has a height of 0.7 µm.

As mentioned above, the process for producing the Group III nitride semiconductor light-emitting device according to Embodiment 1 can improve light extraction efficiency by increasing the depth of the texture provided on the sapphire substrate 10 and prevent the reduction of electrostatic breakdown voltage by suppressing the formation of large pits.

Although the light-emitting device according to Embodiment 1 has a face-up-type structure, the light-emitting device of the present invention may have a flip-chip-type structure.

Embodiment 2

Figure 7:
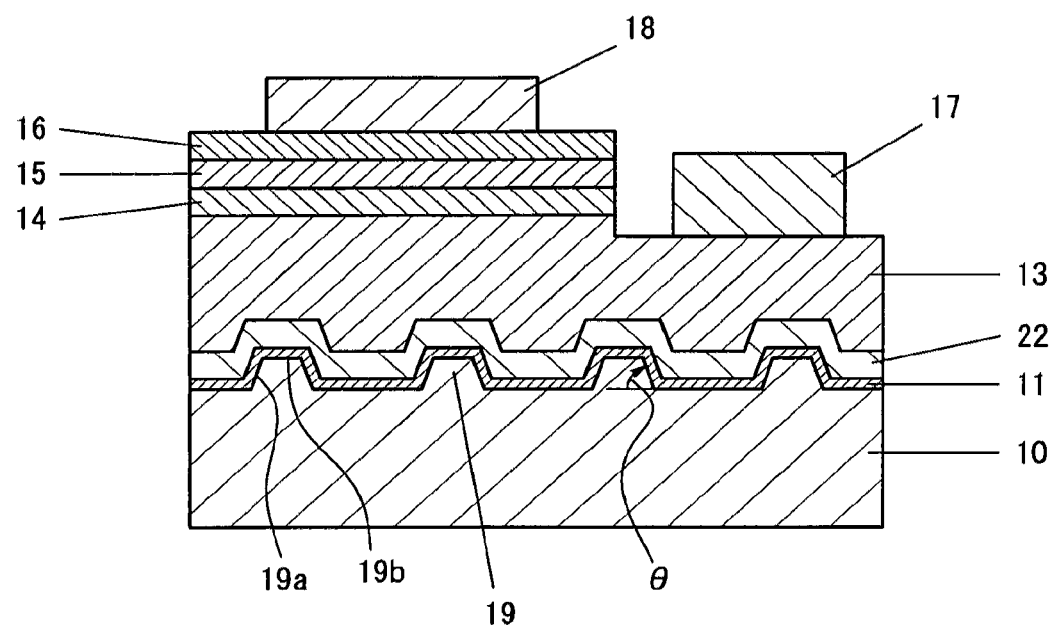
FIG. 7 is the configuration of the Group III nitride semiconductor light-emitting device according to Embodiment 2.

FIG. 7 shows the configuration of a Group III nitride semiconductor light-emitting device according to Embodiment 2. The same reference numerals are assigned to the layers corresponding to those in Embodiment 1. The Group III nitride semiconductor light-emitting device according to Embodiment 2 exhibits improved light extraction efficiency by using a textured sapphire substrate 10. The sapphire substrate 10 has a c-plane main surface, and a GaN preventing layer 22 is formed thereon via a buffer layer 11. The texture provided on the sapphire substrate 10 has a pattern in which dot (truncated hexagonal pyramidal) convex portions 19 having a height of 1.6 µm and a diameter of 3 µm are periodically arranged at intervals of 5 µm. A side surface 19a of the convex portion 19 is inclined by 40° to 80° with respect to the main surface of the sapphire substrate 10. When the inclination angle θ falls within this range, light extraction efficiency can be further improved.

Any Group III nitride semiconductor, for example, AlN or GaN, may be used in the buffer layer 11. However, preferably, AlN is used to suppress pit generation in the crystal.

The preventing layer 22 is formed so as to contour the texture and to cover the entire top surface of the buffer layer 11. Preferably, the thickness of the preventing layer 22 is 20 nm to 1000 nm. When the thickness is smaller than 20 nm, mass transport of the buffer layer 11 is not sufficiently suppressed during the formation of the n-type layer. When the thickness is larger than 1000 nm, crystallinity is deteriorated. More preferably, the thickness of the preventing layer 22 is 50 nm to 500 nm. The preventing layer may be or may not be doped with Si.

The texture pattern formed on the sapphire substrate 10 is not limited to the aforementioned pattern in which the dot convex portions 19 are periodically arranged. The texture pattern may be any pattern, so long as the depth of the texture (the depth of the concave portion or the height of the convex portion) falls within a range of 1 μm to 2 μm and the inclination angle θ of the texture side surface (the angle of the side surface of the concave portion or the side surface of the convex portion with respect to the main surface of the sapphire substrate) falls within a range of 40° to 80°. For example, a pattern in which dot concave portions are periodically arranged or a pattern in which concave portions or convex portions are arranged in a stripe pattern may be used. Also, the texture pattern does not necessarily have to be periodic. Each dot concave portion or convex portion is, for example, a truncated pyramid, a truncated conoid, a pyramid, conoid, or a hemisphere. However, in the case of hemisphere, the angle of the tangent to the sapphire substrate is 40° to 80°. The present invention uses a sapphire substrate provided with a texture having a depth of 1 μm to 2 μm. The reason for this is as follows. When the depth of the texture is smaller than 1 μm, light extraction efficiency is not sufficiently improved. When the depth of the texture is larger than 2 μm, it is difficult to flatten the crystal surface by burying the texture. More preferably, the depth of the texture is 1.4 μm to 2 μm. Preferably, the interval of the convex portions is 8 μm or less to improve light extraction efficiency and 2 μm or more to facilitate burying the texture.

On the preventing layer 22, an n-type layer 13, a light-emitting layer 14, and a p-type layer 15 are sequentially deposited, each of the layers 13 to 15 being formed of Group III nitride semiconductor. A transparent electrode 16 is formed of indium tin oxide (ITO) in a region of the p-type layer 15. A part of the light emitting layer 14 and the p-type layer 15 are removed to expose the n-type layer 13. An n-electrode 17 and a p-electrode 18 are formed respectively on the exposed n-type layer 13 and the transparent electrode 16.

The n-type layer 13, the light emitting-layer 14, and the p-type layer 15 may have any conventionally known structure. The n-type layer 13 has, for example, a structure in which an n-type contact layer formed of GaN and doped with Si at a high concentration and an n-cladding layer formed of GaN are sequentially deposited on the buried layer 12. The light-emitting layer 14 has, for example, an MQW structure in which GaN barrier layers and InGaN well layers are alternately deposited repeatedly. The p-type layer 15 has, for example, a structure in which a p-cladding layer formed of AlGaN doped with Mg and a p-contact layer formed of GaN doped with Mg are sequentially deposited on the light-emitting layer 14.

A buried layer may be provided to flatten the crystal surface by burying the texture between the preventing layer 22 and the n-type layer 13, as in Embodiment 1. When forming the buried layer of GaN, the growth temperature is preferably lower by 30° C. to 70° C. than that (1050° C. to 1200° C.) of the n-type layer 13. This can suppress pit generation. The texture is more easily buried by doping the buried layer with Si.

Next will be described a process for producing the Group II nitride semiconductor light-emitting device according to Embodiment 2 with reference to FIG. 6.

Figure 6A:
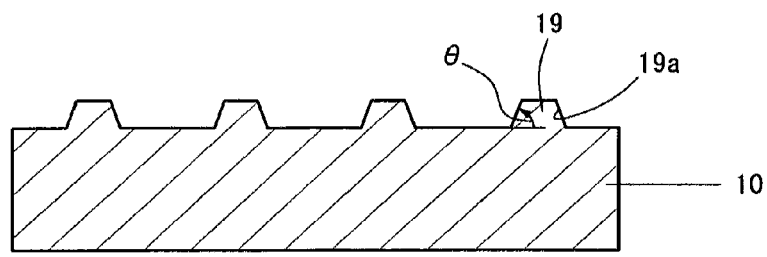
FIGS. 6A to 6D are sketches showing a process for producing a Group III nitride semiconductor light-emitting device according to Embodiment 2.

Firstly, a predetermined pattern texture was formed on a surface of the sapphire substrate 10 by photolithography and dry etching (FIG. 6A). As described above, the texture has a pattern in which the dot-like convex portions 19 are periodically arranged. The height of the convex portion 19 was 1.6 μm, and the inclination angle θ of the side surface 19a of the convex portion 19 was 40° to 80°. The height of the convex portion 19 can be controlled by the etching time. The inclination angle θ of the side surface 19a of the convex portion 19 can be controlled by the shape of a resist mask.

Figure 6B:
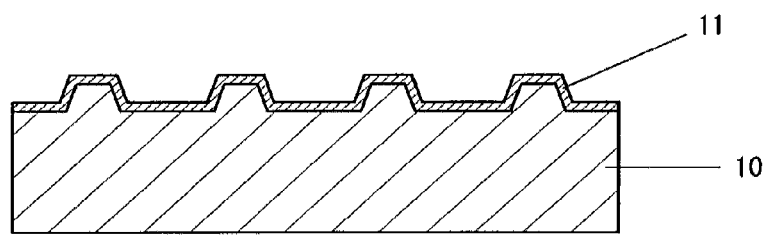

Subsequently, the buffer layer 11 was deposited on the sapphire substrate 10 at 300° C. to 600° C. by the MOCVD method so as to contour the texture of the sapphire substrate 10 (FIG. 6B). Preferably, thermal cleaning is performed to remove impurities from the surface of the sapphire substrate 10 before the formation of the buffer layer 11. Thermal cleaning is performed, for example, in a hydrogen atmosphere at a temperature of 1000° C. to 1200° C.

Figure 6C:
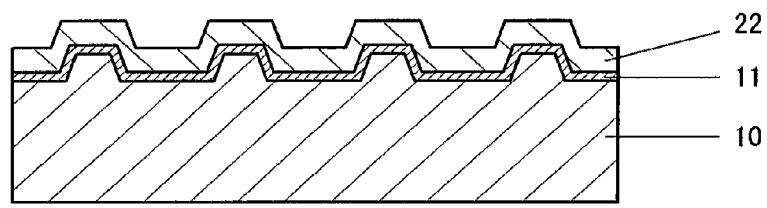

Subsequently, the preventing layer 22 made of GaN was deposited at 600° C. to 1050° C. by the MOCVD method so as to contour the texture of the buffer layer 11, and thus the entire top surface of the buffer layer 11 was covered (FIG. 6C). The reason for forming the preventing layer 22 at a temperature of 600° C. to 1050° C., is because the entire top surface of the buffer layer 11 needs to be covered to prevent mass transport. When AlN is used as the buffer layer 11, the preventing layer 22 is preferably grown at a temperature of 900° C. to 1050° C. This can more effectively suppress mass transport of the buffer layer 11 during the formation of the preventing layer 22.

Preferably, the preventing layer 22 is formed of GaN. However, a Group III nitride semiconductor such as AlGaN, InGaN, AlGaInN, can also be used, in which a portion of Ga is substituted by Al or In.

Figure 6D:
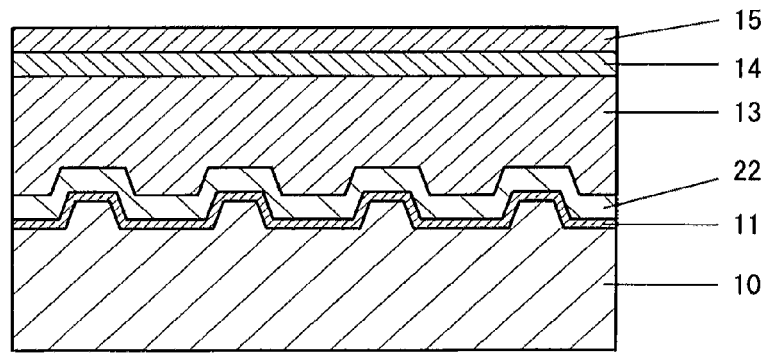

Next, on the preventing layer 22, the n-type layer 13 was deposited at 1050° C. to 1200° C. by the MOCVD method. At this time, mass transport of the buffer layer 11 was suppressed because the entire top surface of the buffer layer 11 was covered by the preventing layer 22. When GaN is used as the buffer layer 11, preferably, nitrogen is used as a carrier gas in heating to form the n-type layer 13. This can effectively suppress mass transport of the buffer layer 11 during heating. Subsequently, on the n-type layer 13, the light emitting layer 14 and the p-type layer 15 were sequentially deposited by the MOCVD method (FIG. 6D).

Subsequently, the transparent electrode 16 comprising indium tin oxide (ITO) was deposited on a part of a surface of the p-type layer 15. Then, the light emitting layer 14 and the p-type layer 15 were partially etched to expose a part of the n-type layer 13. The n-electrode 17 and the p-electrode 18 were formed on an exposed portion of the n-type layer 13 and a part of the transparent electrode 16, respectively.

As mentioned above, the process for producing the Group III nitride semiconductor light-emitting device according to Embodiment 2 suppressed mass transport of the buffer layer 11 by the preventing layer 22. Therefore, even if the light extraction efficiency was further improved by increasing the texture depth of the sapphire substrate 10 to 1 μm to 2 μm and regulating the inclination angle of the texture side surface within a range of 40° to 80°, pit generation in the crystal was able to be suppressed and the deterioration of the electrical characteristics of the device, for example, the reduction of electrostatic breakdown voltage, was able to be prevented.

Although the light-emitting device according to Embodiment 2 has a face-up-type structure, the light-emitting device of the present invention may have a flip-chip-type structure.

Embodiment 3

Figure 9:
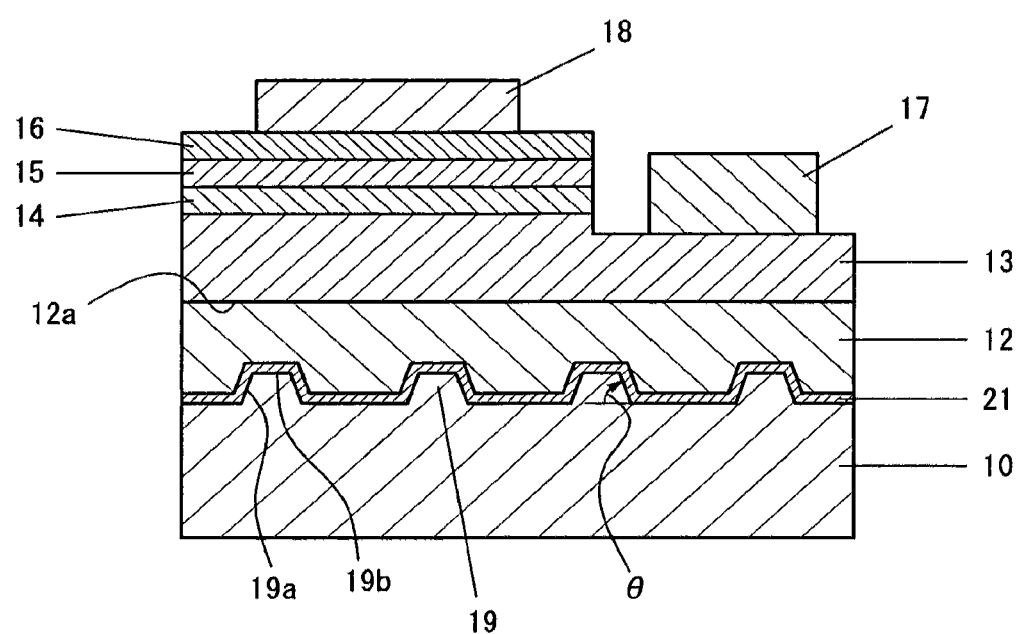
FIG. 9 is the configuration of the Group III nitride semiconductor light-emitting device according to Embodiment 3.

FIG. 9 shows the configuration of a Group III nitride semiconductor light-emitting device according to Embodiment 3. The same reference numerals are assigned to the layers corresponding to those in Embodiments 1 and 2. The Group III nitride semiconductor light-emitting device according to Embodiment 3 exhibits improved light extraction efficiency by using a textured sapphire substrate 10. The sapphire substrate 10 has a c-plane main surface, and a buried layer 12, an n-type layer 13, a light-emitting layer 14, and p-type layer 15 are sequentially deposited thereon via an AlN buffer layer 21. The texture provided on the sapphire substrate 10 has a pattern in which dot-like (truncated hexagonal pyramidal) convex portions 19 having a height of 1.2 μm to 2.5 μm are periodically arranged at a predetermined intervals. A side surface 19a of the convex portion 19 is inclined by 40° to 80° with respect to the main surface of the sapphire substrate 10. When the inclination angle θ falls within this range, light extraction efficiency can be further improved.

The buffer layer 21 is not limited to AlN, but may be any Group III nitride semiconductor containing Al. However, the higher the Al composition ratio is, the more effectively pit generation is suppressed in the crystal. This can reduce variation in crystal orientation. Preferably, AlGaN having an Al composition ratio of 50% or more is used. Most preferably, AlN is used as in Embodiment 3.

The texture pattern formed on the sapphire substrate 10 is not limited to the aforementioned pattern in which the dot convex portions 19 are periodically arranged. The texture pattern may be any pattern, so long as the depth of the texture (the depth of the concave portion or the height of the convex portion) falls within a range of 1.2 μm to 2.5 μm and the inclination angle θ of the texture side surface (the angle of the side surface of the concave portion or the side surface of the convex portion with respect to the main surface of the sapphire substrate) falls within a range of 40° to 80°. For example, a pattern in which dot concave portions are periodically arranged or a pattern in which concave portions or convex portions are arranged in a stripe pattern may be used. Also, the texture pattern does not necessarily have to be periodic. Each dot concave portion or convex portion is, for example, a truncated pyramid, a truncated conoid, a pyramid, a conoid, or a hemisphere. However, in the case of hemisphere, the angle of the tangent to the sapphire substrate is 40° to 80°. The present invention uses a sapphire substrate provided with a texture having a depth of 1.2 μm to 2.5 μm. The reason for this is as follows. When the depth of the texture is smaller than 1.2 μm, light extraction efficiency is not sufficiently improved. When the depth of the texture is larger than 2.5 μm, it is difficult to flatten the crystal surface by burying the texture. More preferably, the depth of the texture is 1.4 μm to 2 μm. When the texture has a pattern in which the dot convex portions are periodically arranged or the convex portions are periodically arranged in a stripe, the interval of the convex portions is preferably 2 μm or more to facilitate burying the texture and 8 μm or less to improve light extraction efficiency.

The buried layer 12 is a layer to flatten the crystal surface by burying the texture. When forming the buried layer 12 of GaN, the growth temperature is preferably lower by 30° C. to 70° C. than that (1050° C. to 1200° C.) of the n-type layer 13. This can suppress pit generation. Also, the texture is more easily buried by doping the buried layer 12 with Si.

The n-type layer 13, the light-emitting layer 14, and the p-type layer 15 are formed in the same way as in Embodiments 1 and 2, and may have the layer structure as illustrated in Embodiments 1 and 2.

A transparent electrode 16 made of indium tin oxide (ITO) is formed on a region of the p-type layer 15. A part of the light emitting layer 14 and the p-type layer 15 are removed to expose a part of the n-type layer 13. An n-electrode 17 and a p-electrode 18 are formed on the exposed n-type layer 13 and the transparent electrode 16, respectively.

Next will be described a process for producing the Group II nitride semiconductor light-emitting device according to Embodiment 3 with reference to FIG. 8.

Figure 8A:
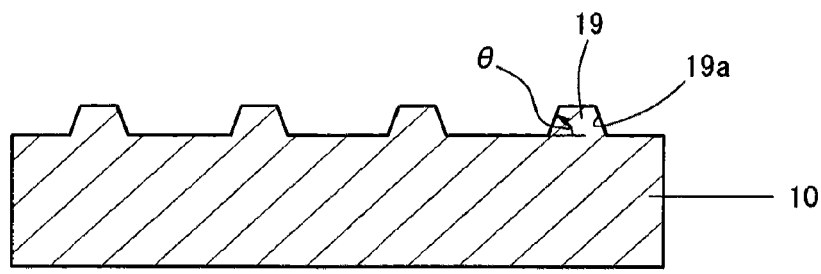
FIGS. 8A to 8D are sketches showing a process for producing a Group III nitride semiconductor light-emitting device according to Embodiment 3.

Firstly, a predetermined pattern texture was formed on a surface of the sapphire substrate 10 by photolithography and dry etching (FIG. 8A). As described above, the texture had a pattern in which the dot convex portions 19 are periodically arranged. The height of the convex portion 19 was 1.2 μm to 2.5 μm, and the inclination angle θ of the side surface 19a of the convex portion 19 was 40° to 80°. The height of the convex portion 19 can be controlled by the etching time. The inclination angle θ of the side surface 19a of the convex portion 19 can be controlled by the shape of a resist mask.

Subsequently, thermal cleaning was performed in a hydrogen atmosphere at a temperature of 1000° C. to 1200° C. to remove impurities from the surface of the sapphire substrate 10. Thermal cleaning was able to prevent the seeds of crystal growth from being formed on the side surface 19a of the convex portion 19 in the early stage of crystal growth when forming the buried layer 12.

Figure 8B:
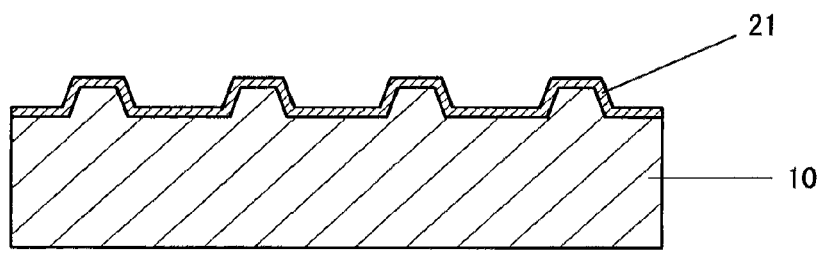

Next, the buffer layer 21 of AlN was deposited on the sapphire substrate 10 at 300° C. to 600° C. by the MOCVD method so as to contour the texture of the sapphire substrate 10 (FIG. 8B).

Figure 8C:
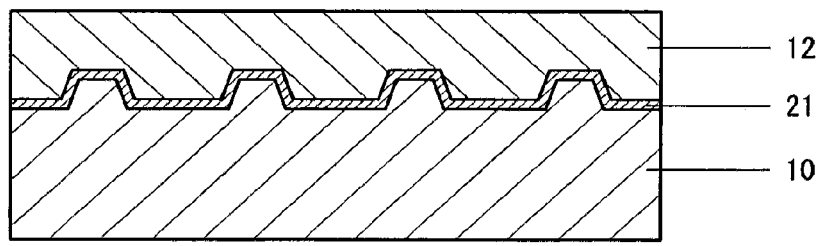
Figure 8D:
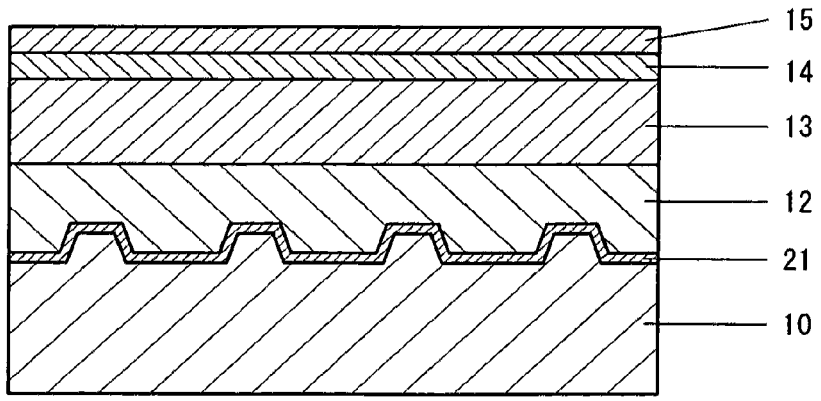

Subsequently, the buried layer 12 was deposited on the buffer layer 21 by the MOCVD method. The thickness of the buried layer 12 was 3 μm to 6 μm, and the surface of the buried layer 12 was flat by burying the texture (FIG. 8C). Since AlN was used as the buffer layer 21, the crystal seeds were formed only on the c-plane of the sapphire substrate 10 in the early growth stage of the buffer layer 12, and crystal seed formation was suppressed on the side surface 19a of the convex portion 19 that is not the c-plane. That is, crystal seed formation was suppressed on the side surface 19a of the convex portion 19 by using AlN as the buffer layer 21 and by performing thermal cleaning before formation of the buffer layer 11. Therefore, even if the side surface 19a of the convex portion 19 had an inclination angle θ of 40° to 80° and the height of the convex portion 19 was increased to 1.2 μm to 2.5 μm and the area of the side surface 19a of the convex portion 19 was increased, no pits were formed in the crystal of the buried layer 12, and high quality crystals having less variation in crystal orientation were obtained.

Next, on the buried layer 12, the n-type layer 13, the light-emitting layer 14, and the p-type layer 15 were sequentially deposited by the MOCVD method (FIG. 8D), and the transparent electrode 16 comprising indium tin oxide (ITO) was deposited on a part of a surface of the p-type layer 15. The n-type layer 13, the light-emitting layer 14, and the p-type layer 15 can use the same structure as that of Embodiment 1. The light emitting layer 14 and the p-type layer 15 were partially etched to expose a part of the n-type layer 13. The n-electrode 17 and the p-electrode 18 are formed on an exposed portion of the n-type layer 13 and a part of the transparent electrode 16, respectively. Through the above, the Group III nitride semiconductor light-emitting device according to Embodiment 3 was produced.

FIG. 10 shows photographs of the surfaces of the n-type layers 13. FIG. 10A shows a photograph of the surface of the n-type layer 13 formed under the following conditions according to Embodiment 3 (hereinafter, referred to as a sample of Embodiment 3): the height of the convex portion 19 is 1.5 μm; the inclination angle θ of the side surface 19a of the convex portion 19 is 60°; thermal cleaning is performed at 1150° C.; the buffer layer 21 is formed by depositing AlN for 60 seconds at 380° C.; the buried layer 12 is formed by growing GaN doped with Si at 1125° C. FIG. 10B shows the surface of the n-type layer 13 formed under the same conditions as those of FIG. 10A other than that the buffer layer 21 is formed by depositing GaN for 240 seconds at 520° C. (hereinafter, referred to as a sample of Comparison Example 1). As is clear from FIGS. 10A and 10B, when GaN was used as the buffer layer 21, numerous large pits were formed on the surface of the n-type layer 13. In contrast, when AlN was used as the buffer layer 21, no pits were formed on the surface of the n-type layer 13.

FIG. 11A shows a schematic view of crystal growth when AlN is used as the buffer layer 21. FIG. 11B shows a schematic view of crystal growth when GaN is used as the buffer layer 21. As shown in FIG. 11A, when AlN is used as the buffer layer, GaN is selectively grown only on the c-plane of the sapphire substrate 10 in the early stage of crystal growth. GaN is not grown on the side surface 19a of the convex portion 19 that is not the c-plane. Since the buried layer 12 is formed of only GaN grown on the c-plane, high quality crystals having the same crystal orientation are obtained. On the other hand, as shown in FIG. 11B, when GaN is used as the buffer layer 21, GaN is grown on the side surface 19a of the convex portion 19 as well as the c-plane of the sapphire substrate 10. GaN grown on the side surface 19a of the convex portion 19 is polycrystallized or has a different crystal orientation from that of the GaN grown on the c-plane. Therefore, crystals of the buried layer 12 exhibit poor quality, which contain polycrystals and crystals having different crystal orientations.

Figure 12A:
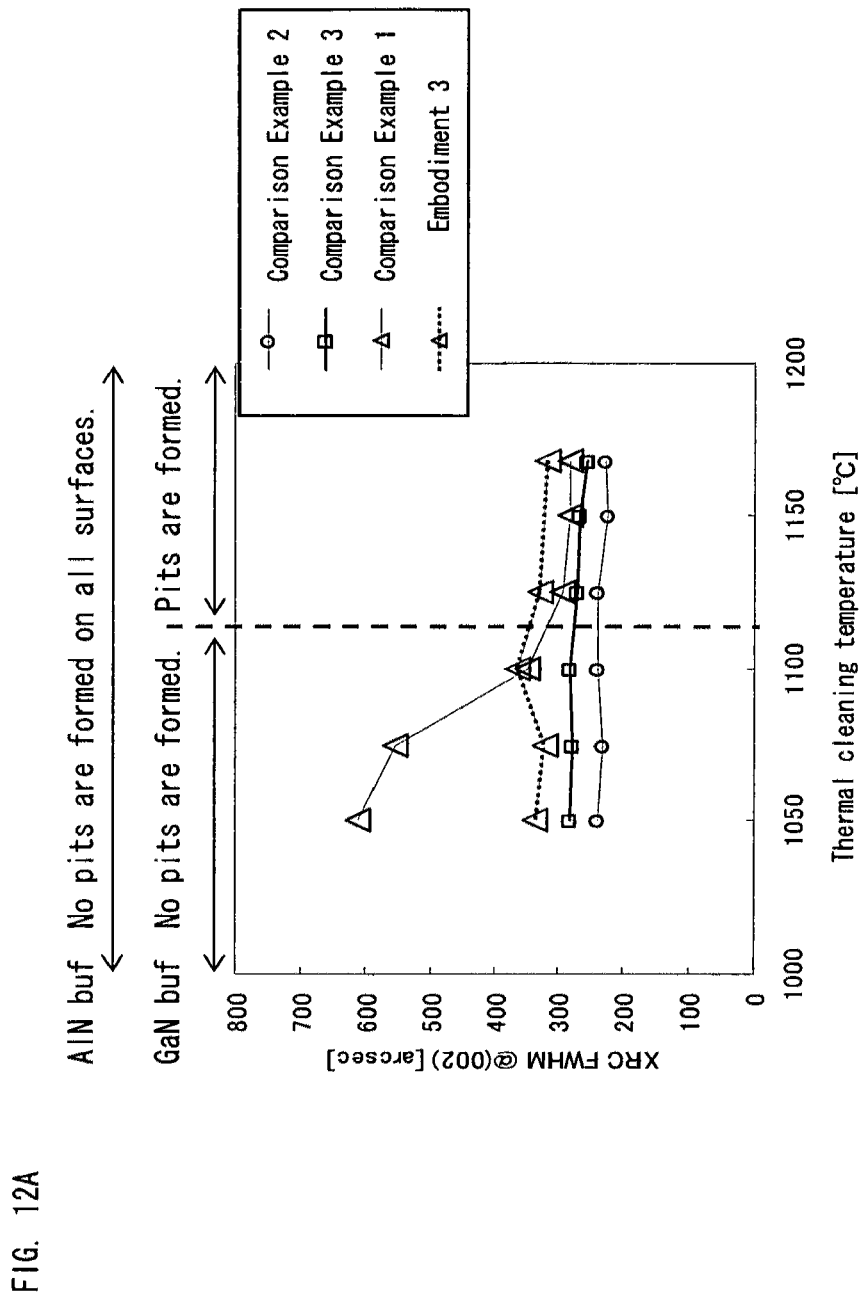
FIGS. 12A and 12B are graphs showing dependencies on thermal cleaning temperature of XRC half width.
Figure 12B:
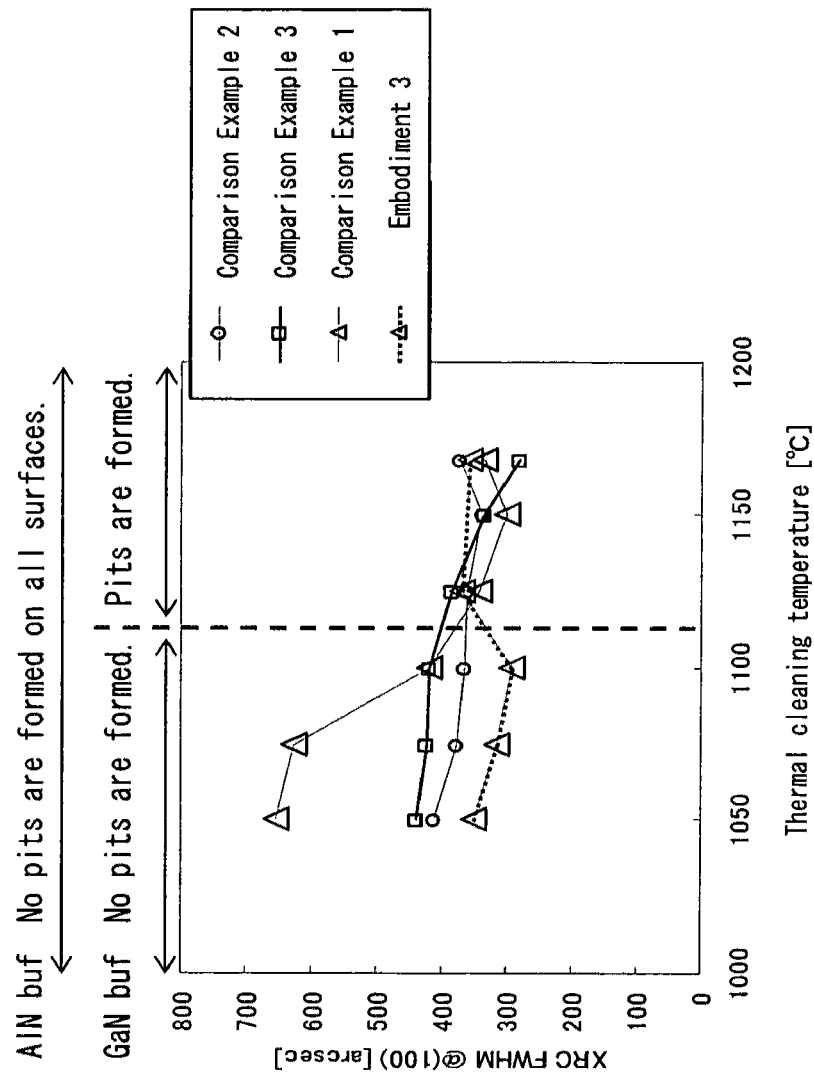

FIG. 12A is a graph showing the relationship between XRC (X-ray rocking curve) half width of the (0002) plane and thermal cleaning temperature. FIG. 12B is a graph showing the relationship between XRC (X-ray rocking curve) half width of the (10-10) plane and thermal cleaning temperature. In addition to the sample of Embodiment 3 and the sample of Comparison Example 1, the following samples were used in measurement: a sample of Comparison Example 2 that was prepared in the same way as the sample of Embodiment 3 except for not texturing the sapphire substrate 10 and using GaN as the buffer layer 21, and a sample of Comparison Example 3 that was prepared in the same way as the sample of Embodiment 3 except for the height of the convex portion 19 being 0.7 μm, the inclination angle of the side surface being 75°, and using GaN as the buffer layer 21.

As is clear from the data shown in FIGS. 12A and 12B, when AlN was used as the buffer layer 21, there was almost no dependency between the XRC half width and the thermal cleaning temperature. Also, no pits were formed regardless of the thermal cleaning temperature. On the other hand, when GaN was used as the buffer layer 21, there was almost no dependency between the XRC half width and the thermal cleaning temperature in Comparison Examples 2 and 3. However, when the thermal cleaning temperature was higher than 1125° C., pits were formed. The data of Comparison Example 1 shows that when the thermal cleaning temperature was 1100° C. or lower, the XRC half width increased, resulting in poor crystallinity. Also, when the thermal cleaning temperature was higher than 1125° C., pits were formed. That is, if the convex portion 19 is higher as in Comparison Example 1, it is difficult to improve crystallinity as well as prevent pit generation by controlling the thermal cleaning temperature when GaN is used as the buffer layer 21. In contrast, when AlN is used as the buffer layer 21 as in Embodiment 3, pit generation can be prevented while better crystallinity is achieved even if the convex portion 19 is higher.

It is considered from comparison between the embodiment 3 using AlN buffer layer and the comparison example 1 using GaN buffer layer in FIGS. 12A and 12B that the higher the Al composition ratio, the smaller the increase rate of the XRC half width due to lowering of the thermal cleaning temperature. Therefore, AlN is most preferable for the buffer layer 21. When a semiconductor except for AlN is used as the buffer layer 21, it is preferable that a Group III nitride semiconductor having a higher Al composition ratio is used. Particularly preferably, AlGaN having an Al composition ratio of 50% or more is used.

Although the light-emitting device according to Embodiment 3 has a face-up-type structure, the light-emitting device of the present invention may have a flip-chip-type structure.

The Group III nitride semiconductor light-emitting device of the present invention can be used in, for example, an illumination apparatus.

What is claimed is:

1. A method for producing a Group III nitride semiconductor light-emitting device comprising an n-type layer, a light-emitting layer, and a p-type layer, which are made of Group III nitride semiconductor, sequentially deposited on a buffer layer which is deposited on a sapphire substrate having a c-plane main surface, said main surface having a texture structure, the method comprising:

forming the texture on the main surface of the sapphire substrate so as to have a depth of 1 μm to 2 μm;

forming a buried layer of Group III nitride semiconductor on the buffer layer, to flatten a top surface by burying the texture, at a temperature which is lower by 20° C. to 80° C. than that when the n-type layer is formed; and forming the n-type layer on the buried layer at a temperature of 1000° C. to 1200° C., wherein a side surface of the texture provided on the sapphire substrate is inclined by 40° to 80°.

2. A method for producing a Group III nitride semiconductor light-emitting device according to claim 1, wherein the buried layer is doped with Si.

3. A method for producing a Group III nitride semiconductor light-emitting device according to claim 1, wherein the buried layer has a thickness of 1 μm to 3 μm.

4. A method for producing a Group III nitride semiconductor light-emitting device according to claim 1, wherein the buffer layer is formed of AlN.

5. A method for producing a Group III nitride semiconductor light-emitting device comprising an n-type layer, a light-emitting layer, and a p-type layer, which are made of Group III nitride semiconductor, sequentially deposited on a buffer layer which is deposited on a sapphire substrate having a c-plane main surface, said main surface having a texture structure, the method comprising:

forming the texture on the sapphire substrate so as to have a side surface inclined by 40° to 80° and a depth of 1 μm to 2 μm;

forming a preventing layer of Group III nitride semiconductor on the buffer layer to prevent mass transport of the buffer layer, at a temperature of 600° C. to 1050° C. so as to cover the entire top surface of the buffer layer; and forming the n-type layer on the preventing layer at a temperature of 1050° C. to 1200° C.

6. A method for producing a Group III nitride semiconductor light-emitting device according to claim 5, wherein the buffer layer is formed of AlN; and the preventing layer is formed at a temperature of 900° C. to 1050° C.

7. A method for producing a Group III nitride semiconductor light-emitting device according to claim 5, wherein the buffer layer is formed of GaN; and nitrogen is used as a carrier gas in heating to form the n-type layer.

8. A method for producing a Group III nitride semiconductor light-emitting device according to claim 5, wherein the preventing layer has a thickness of 20 nm to 1000 nm.

9. A method for producing a Group III nitride semiconductor light-emitting device comprising layers which are made of Group III nitride semiconductor, sequentially deposited on a buffer layer which is deposited on a sapphire substrate having a c-plane main surface, said main surface having a texture structure, the method comprising:

forming the texture on the sapphire substrate so as to have a depth of 1.2 μm to 2.5 μm and a side surface inclined by 40° to 80° and;

forming the buffer layer of Group III nitride semiconductor containing Al.

10. A method for producing a Group III nitride semiconductor light-emitting device according to claim 9, wherein the buffer layer is formed of AlGaN having an Al composition ratio of 50% or more.

11. A method for producing a Group III nitride semiconductor light-emitting device according to claim 10, wherein the buffer layer is formed of AlN.

12. A method for producing a Group III nitride semiconductor light-emitting device according to claim 9, wherein heat treatment is performed in a hydrogen atmosphere at a temperature of 1000° C. to 1200° C. before forming the buffer layer after the formation of the sapphire substrate.

* * * * *